(12) United States Patent
Huang et al.

(10) Patent No.: US 9,941,287 B2
(45) Date of Patent: *Apr. 10, 2018

(54) THREE-DIMENSIONAL STATIC RANDOM ACCESS MEMORY DEVICE STRUCTURES

(71) Applicant: Taiwan Semiconductor Manufacturing Company Limited, Hsinchu (TW)

(72) Inventors: Chien-Yu Huang, Taoyuan County (TW); Chien-Yuan Chen, Hsinchu (TW); Hau-Tai Shieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/411,285

(22) Filed: Jan. 20, 2017

(65) Prior Publication Data
US 2017/0133387 A1    May 11, 2017

Related U.S. Application Data

(63) Continuation of application No. 14/097,308, filed on Dec. 5, 2013, now Pat. No. 9,558,791.

(51) Int. Cl.
| | |
|---|---|
| *H01L 27/11* | (2006.01) |
| *G11C 11/418* | (2006.01) |
| *G11C 11/419* | (2006.01) |
| *H01L 23/528* | (2006.01) |
| *H01L 21/8234* | (2006.01) |

(52) U.S. Cl.
CPC ........ *H01L 27/1104* (2013.01); *G11C 11/418* (2013.01); *G11C 11/419* (2013.01); *H01L 21/8234* (2013.01); *H01L 23/528* (2013.01)

(58) Field of Classification Search
CPC ............ H01L 27/1104; H01L 21/8234; H01L 23/528; G11C 11/418; G11C 11/419
USPC ............ 365/51; 257/202, 211; 438/128, 129
See application file for complete search history.

(56) References Cited

U.S. PATENT DOCUMENTS

| | | | | |
|---|---|---|---|---|
| 4,398,248 A | * | 8/1983 | Hsia ..................... | G11C 29/765 365/200 |
| 6,487,102 B1 | * | 11/2002 | Halbert .................... | G11O 5/02 365/51 |

(Continued)

*Primary Examiner* — Vu Le
*Assistant Examiner* — Sung Cho
(74) *Attorney, Agent, or Firm* — Slater Matsil, LLP

(57) ABSTRACT

Systems and methods are provided for fabricating a static random access memory (SRAM) cell in a multi-layer semiconductor device structure. An example SRAM device includes a first array of SRAM cells, a second array of SRAM cells, a processing component, and one or more inter-layer connection structures. The first array of SRAM cells are formed in a first device layer of a multi-layer semiconductor device structure. The second array of SRAM cells are formed in a second device layer of the multi-layer semiconductor device structure, the second device layer being formed on the first device layer. The processing component is configured to process one or more input signals and generate one or more access signals. One or more inter-layer connection structures are configured to transmit the one or more access signals to activate the first device layer or the second device layer for allowing access to a target SRAM cell.

20 Claims, 6 Drawing Sheets

(56) References Cited

U.S. PATENT DOCUMENTS

| | | | | |
|---|---|---|---|---|
| 6,594,169 B2* | 7/2003 | Sakui | G06F 13/4234 | 365/230.03 |
| 6,642,555 B1* | 11/2003 | Ishida | G11C 11/412 | 257/202 |
| 7,142,471 B2* | 11/2006 | Fasoli | G11C 29/76 | 365/185.09 |
| 7,209,376 B2* | 4/2007 | Saito | G11C 5/04 | 257/759 |
| 7,221,614 B2* | 5/2007 | Saito | G11C 5/02 | 365/230.03 |
| 7,558,096 B2* | 7/2009 | Ikeda | G11C 5/02 | 365/185.09 |
| 7,688,621 B2* | 3/2010 | Cho | G11C 7/1078 | 365/163 |
| 7,898,893 B2* | 3/2011 | Park | G11C 5/02 | 365/148 |
| 7,940,578 B2* | 5/2011 | Kang | G11C 7/02 | 365/189.09 |
| 7,982,504 B1* | 7/2011 | Robinett | H01L 21/82387 | 326/101 |
| 8,054,663 B2* | 11/2011 | Chung | G11O 5/02 | 365/194 |
| 9,432,298 B1* | 8/2016 | Smith | H04L 49/9057 | |
| 2010/0058127 A1* | 3/2010 | Terao | G11C 13/0004 | 714/718 |
| 2010/0091541 A1* | 4/2010 | Park | G11C 5/02 | 365/51 |
| 2010/0246234 A1* | 9/2010 | Ahn | G11C 5/02 | 365/51 |
| 2011/0060888 A1* | 3/2011 | Keeth | G11C 29/808 | 711/209 |
| 2011/0103121 A1* | 5/2011 | Osakabe | G11O 5/025 | 365/51 |
| 2011/0122676 A1* | 5/2011 | Murooka | G11O 5/063 | 365/148 |
| 2011/0305100 A1* | 12/2011 | Yu | G11O 5/025 | 365/226 |
| 2012/0063208 A1* | 3/2012 | Koyama | G11O 5/025 | 365/149 |
| 2013/0148411 A1* | 6/2013 | Atsumi | G11C 8/08 | 365/149 |
| 2015/0146480 A1* | 5/2015 | Chen | G11C 11/418 | 365/156 |
| 2015/0255141 A1* | 9/2015 | Koyama | G11O 5/025 | 365/51 |

\* cited by examiner

THREE-DIMENSIONAL STATIC RANDOM ACCESS MEMORY DEVICE STRUCTURES

CROSS-REFERENCE TO RELATED APPLICATIONS

This application is a continuation of U.S. patent application Ser. No. 14/097,308, filed Dec. 5, 2013, which is incorporated herein by reference in its entirety.

FIELD

The technology described in this disclosure relates generally to electronic devices and more particularly to memory devices.

BACKGROUND

Static random access memory (SRAM) devices are widely used for electronic applications where high speed, low power consumption and simple operations are needed. A SRAM device often includes a number of memory cells, and each cell may contain multiple transistors.

SUMMARY

In accordance with the teachings described herein, systems and methods are provided for fabricating a static random access memory (SRAM) cell in a multi-layer semiconductor device structure. An example SRAM device includes a first array of SRAM cells, a second array of SRAM cells, a processing component, and one or more inter-layer connection structures. The first array of SRAM cells are formed in a first device layer of a multi-layer semiconductor device structure. The second array of SRAM cells are formed in a second device layer of the multi-layer semiconductor device structure, the second device layer being formed on the first device layer. The processing component is configured to process one or more input signals and generate one or more access signals. One or more inter-layer connection structures are configured to transmit the one or more access signals to activate the first device layer or the second device layer for allowing access to a target SRAM cell located in the first array of SRAM cells or in the second array of SRAM cells.

In one embodiment, a SRAM device includes a first array of SRAM cells, a second array of SRAM cells, a processing component, and one or more inter-layer connection structures. The first array of SRAM cells are formed in a first device layer of a multi-layer semiconductor device structure. The second array of SRAM cells are formed in a second device layer of the multi-layer semiconductor device structure, the second device layer being formed on the first device layer. One or more inter-layer connection structures are configured to transmit one or more access signals to activate the first device layer or the second device layer for allowing access to a target SRAM cell located in the first array of SRAM cells or in the second array of SRAM cells. A global input/output circuit is configured to output data read from the target SRAM cell and receive data to be written to the target SRAM cell.

In another embodiment, a method is provided for fabricating a static random access memory (SRAM) device in a multi-layer semiconductor device structure. For example, a first array of SRAM cells are formed in a first device layer of a multi-layer semiconductor device structure. A second array of SRAM cells are formed in a second device layer of the multi-layer semiconductor device structure, the second device layer being formed on the first device layer. One or more inter-layer connection structures capable of transmitting one or more access signals to activate the first device layer or the second device layer for allowing access to a target SRAM cell located in the first array of SRAM cells or in the second array of SRAM cells.

DETAILED DESCRIPTION

Figure 1:
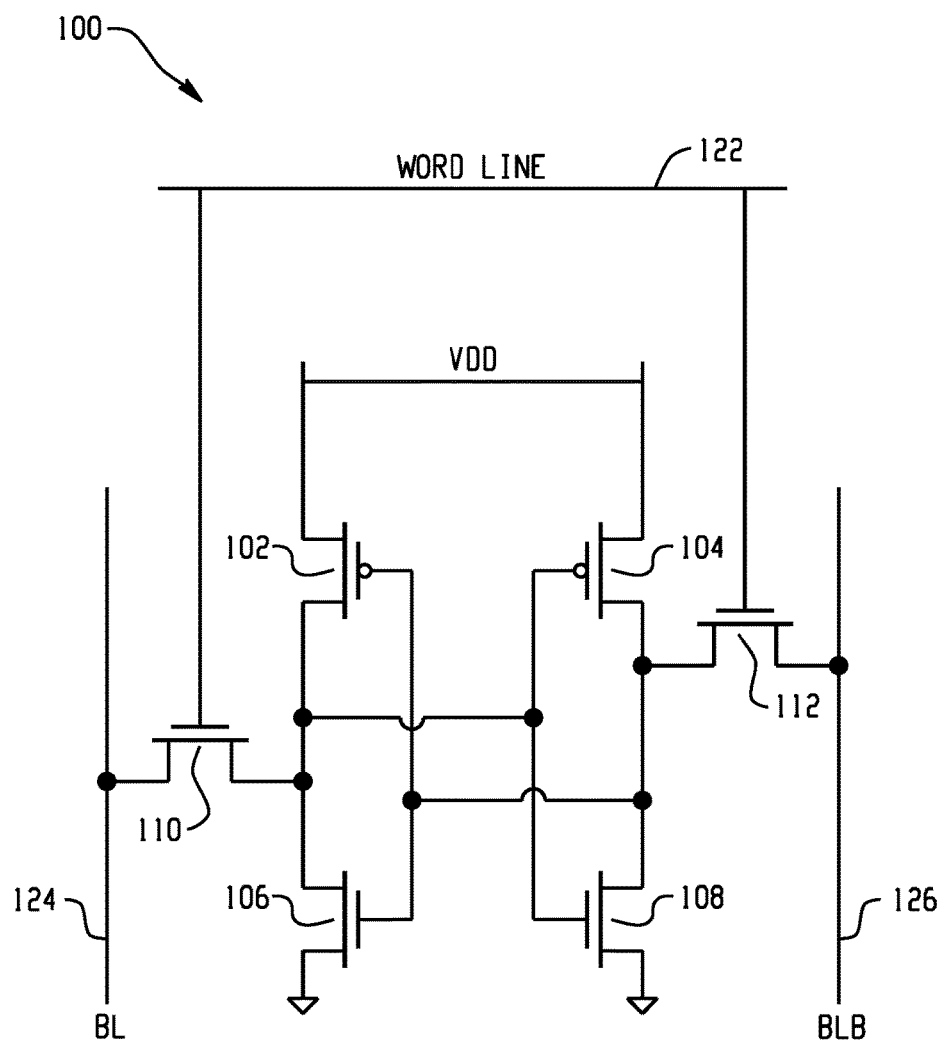
FIG. 1 depicts an example diagram of a six-transistor (6-T) SRAM cell.

FIG. 1 depicts an example diagram of a six-transistor (6-T) SRAM cell. As shown in FIG. 1, the SRAM cell 100 includes two pull-up transistors 102 and 104 (e.g., P-channel transistors), two pull-down transistors 106 and 108 (e.g., N-channel transistors), and two pass-gate transistors 110 and 112 (e.g., N-channel transistors). The transistors 102, 104, 106 and 108 are connected in cross-coupled inverter configuration and form a flip-flop for storing data. The pass-gate transistors 110 and 112 are both coupled to a word line 122 that corresponds to a row in a memory array including the SRAM cell 100. Two complementary bit lines 124 and 126 are coupled to the pass-gate transistors 110 and 112 respectively.

Usually, the SRAM cell 100 operates in a read mode, a write-enable mode, or a power-down mode (i.e., a data-retention mode). In a read mode, the pass-gate transistors 110 and 112 are turned on in response to a word-line signal from the word line 122 to perform a read operation. A data bit stored in the SRAM cell 100 may be read out through the bit lines 124 and 126. In a write-enable mode, a write operation is performed to write a new data bit to the SRAM cell 100 through the bit lines 124 and 126 when a word-line signal from the word line 122 turns on the pass-gate transistors 110 and 112. Furthermore, in the power-down mode, the pass-gate transistors 110 and 112 are turned off, and the data bit is stored in the SRAM cell 100.

Figure 2:
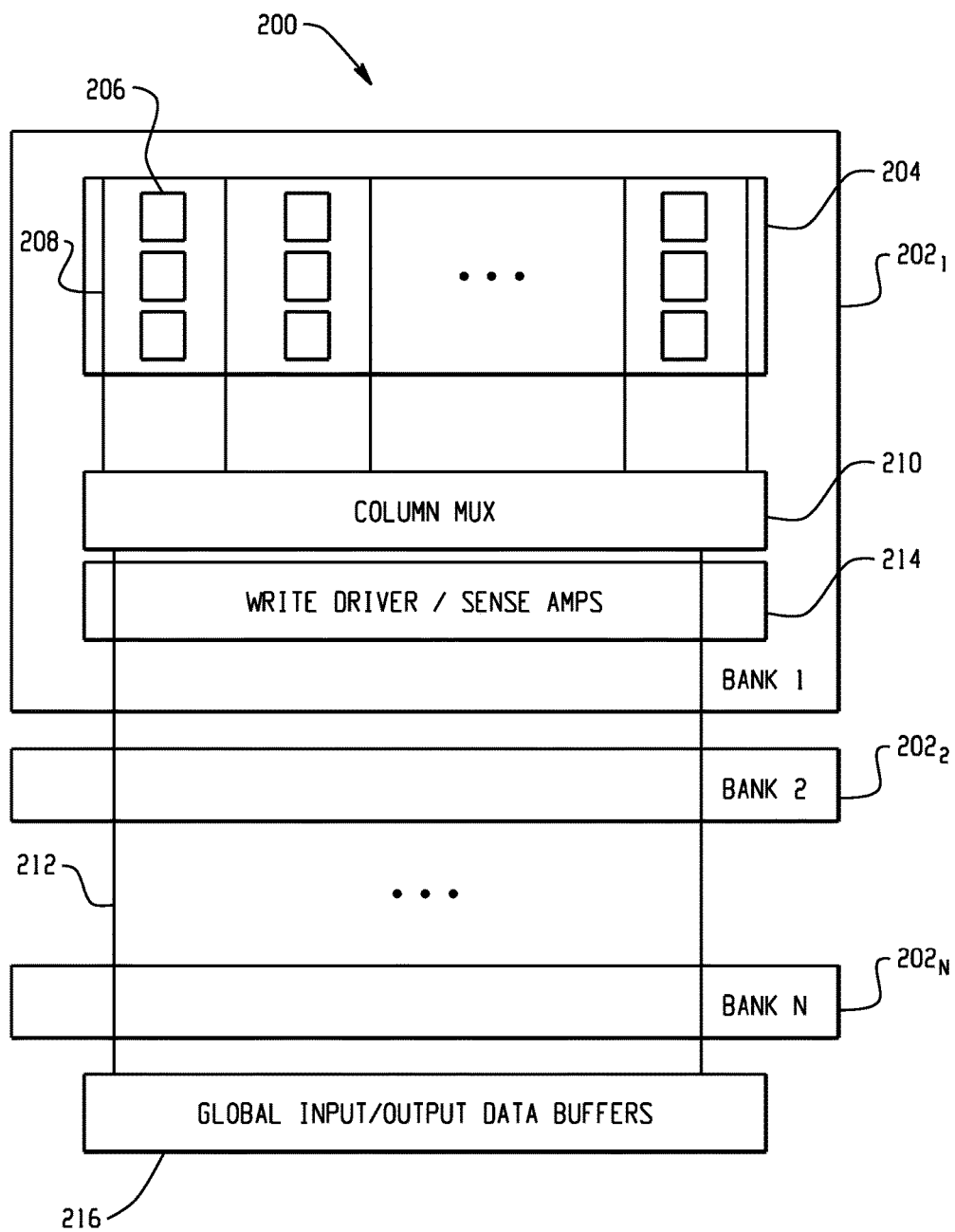
FIG. 2 depicts an example diagram of a SRAM device.

FIG. 2 depicts an example diagram of a SRAM device. As shown in FIG. 2, the SRAM device 200 includes multiple SRAM banks $202_1$, $202_2$, ..., $202_N$, where N is an integer larger than 1. For example, within the SRAM bank $202_1$, a SRAM array 204 contains multiple SRAM cells 206 disposed at intersections of rows and columns of the SRAM array 204. A plurality of local bit lines 208 are arranged along the columns of the SRAM array 204, and a plurality of word lines (not shown in FIG. 2) are arranged along the rows of the SRAM array 204. Through certain selection circuitry, a column multiplexer 210 selects a subset of the local bit lines 208 for access. One or more global bit lines 212 are coupled to the local bit lines 208 through the column multiplexer 210 and write-driver/sense-amps circuits 214. An input/output data buffer 216 provides buffers for reading data out from and/or receiving input data to the SRAM device 200. For example, as shown in FIG. 2, the global bit lines 212 are also used by the SRAM banks $202_2, \ldots, 202_N$. As an example, the SRAM cells 206 include six-transistor SRAM cells (e.g., the SRAM cell 100), eight-transistor SRAM cells, or other types of SRAM cells.

As shown in FIG. 2, the lengths of the local bit lines 208 and the lengths of the global bit lines 212 both affect the speed of the SRAM device 200. One approach to increase the speed of a SRAM device is to shorten the local bit lines 208.

Figure 3:
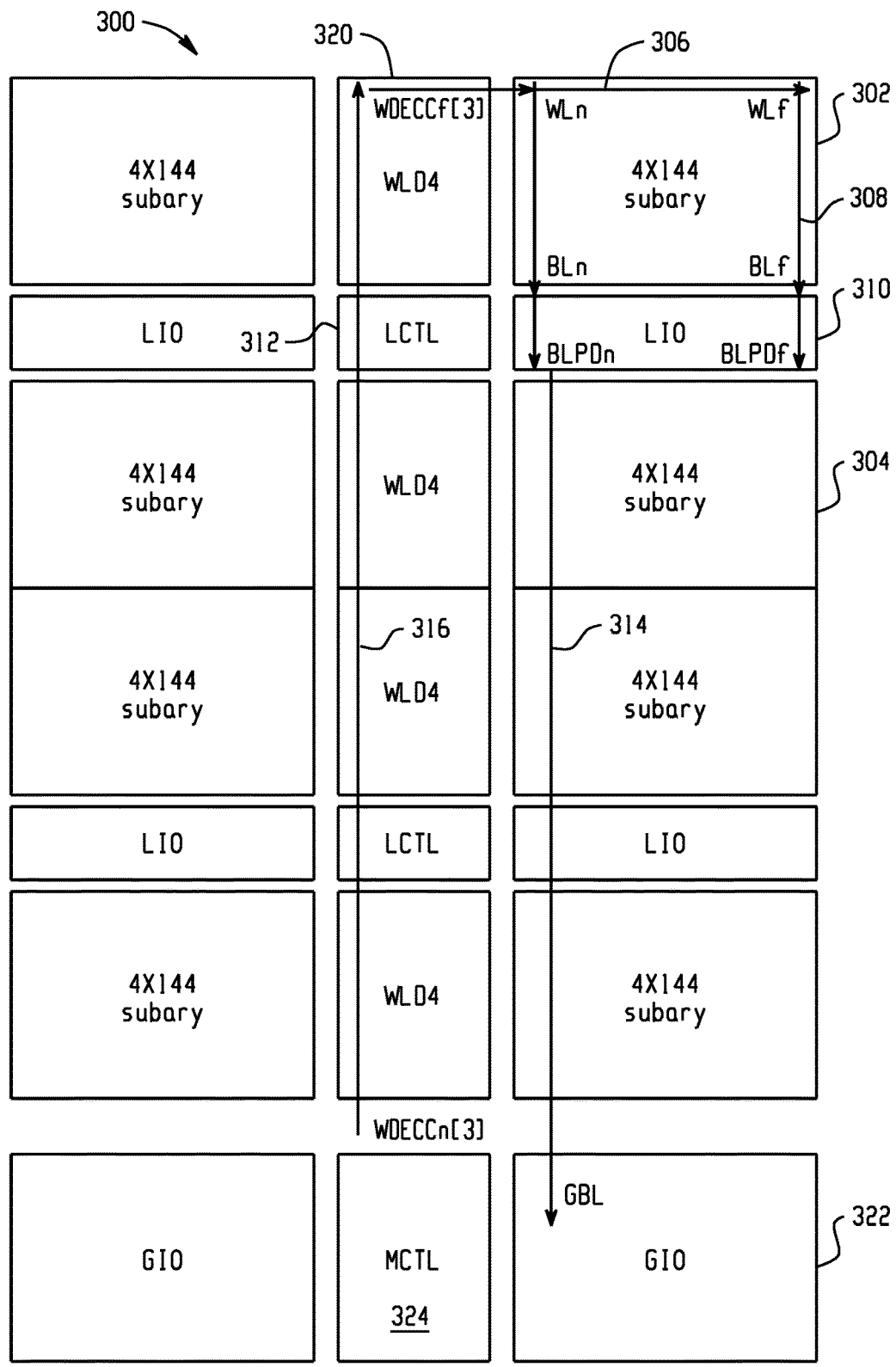
FIG. 3 depicts an example diagram showing a SRAM device with memory sub-arrays.

FIG. 3 depicts an example diagram showing a SRAM device with memory sub-arrays. As shown in FIG. 3, in a SRAM device 300, a SRAM array is divided into multiple sub-arrays (e.g., SRAM sub-arrays 302 and 304). For example, each sub-array has a 4×144 configuration, i.e., 4 rows and 144 columns. Each row corresponds to a word line, and each column corresponds to one or more local bit lines. As an example, within the sub-array 302, one or more word lines 306 are arranged in a horizontal direction, and one or more local bit lines 308 are arranged in a vertical direction.

Global control (MCTL) circuits (e.g., the MCTL circuit 324) are configured to perform certain control functions, such as pre-decoding input signals (e.g., address signals, read/write signals, and/or clock signals) for accessing a target memory cell. Global input/output (GIO) circuits (e.g., the GIO circuit 322) are configured to read out data stored in a memory cell or receive data to be written to a memory cell. Each sub-array in the SRAM device 300 is associated with a local input/output (LIO) circuit, a local control (LCTL) circuit, and a word-line driver (WLD4). For example, the sub-array 302 is associated with a LIO circuit 310, a LCTL circuit 312 and a WLD4 320. The LIO circuit 310 and the WLD4 320 are configured to access one or more memory cells in the sub-array 302, e.g., based on the pre-decoded input signals. The WLD4 320 is configured to activate a particular word line, and the LIO circuit 310 is configured to activate one or more particular local bit lines so that one or more memory cells corresponding to the activated word line and the activated bit lines can be accessed to perform read/write operations. The LIO circuit 310 is further configured to communicate with the GIO circuit 322 through a global bit line (GBL) 314. The LCTL circuit 312 is configured to communicate with the MCTL circuit 324 through a global word-line-decoder (WDECC) line 316. For example, the LCTL circuit 312 receives the pre-decoded input signals from the MCTL circuit 324, determines information associated with a particular word line and/or one or more particular local bit lines to be activated, and provides the information to the LIO circuit 310 and the WLD4 320.

As shown in FIG. 3, dividing the SRAM array into multiple small sub-arrays often requires, for each sub-array, a LIO circuit and a LCTL circuit which occupy more areas on the chip. Furthermore, though dividing the SRAM array into multiple small sub-arrays results in shortened local bit lines, the global bit lines (GBL) and the global word-line-decoder (WDECC) lines are prolonged. For example, the global bit line 314 as shown in FIG. 3 needs to extend over not only three sub-arrays but also two LIO circuits, and the WDECC line 316 needs to extend over not only four sub-arrays but also two local control circuits. In contrast, neither the LIO circuits (e.g., the LIO circuit 310) nor the local control circuits (e.g., the local control circuit 312) are needed for an undivided SRAM array, and the undivided SRAM array would have a global bit line extending over three sub-arrays and a WDECC line extending over four sub-arrays. The benefits of shortened local bit lines in the SRAM device 300 with respect to increasing speed are reduced due to the prolonged global bit lines and the prolonged WDECC lines.

Figure 4:
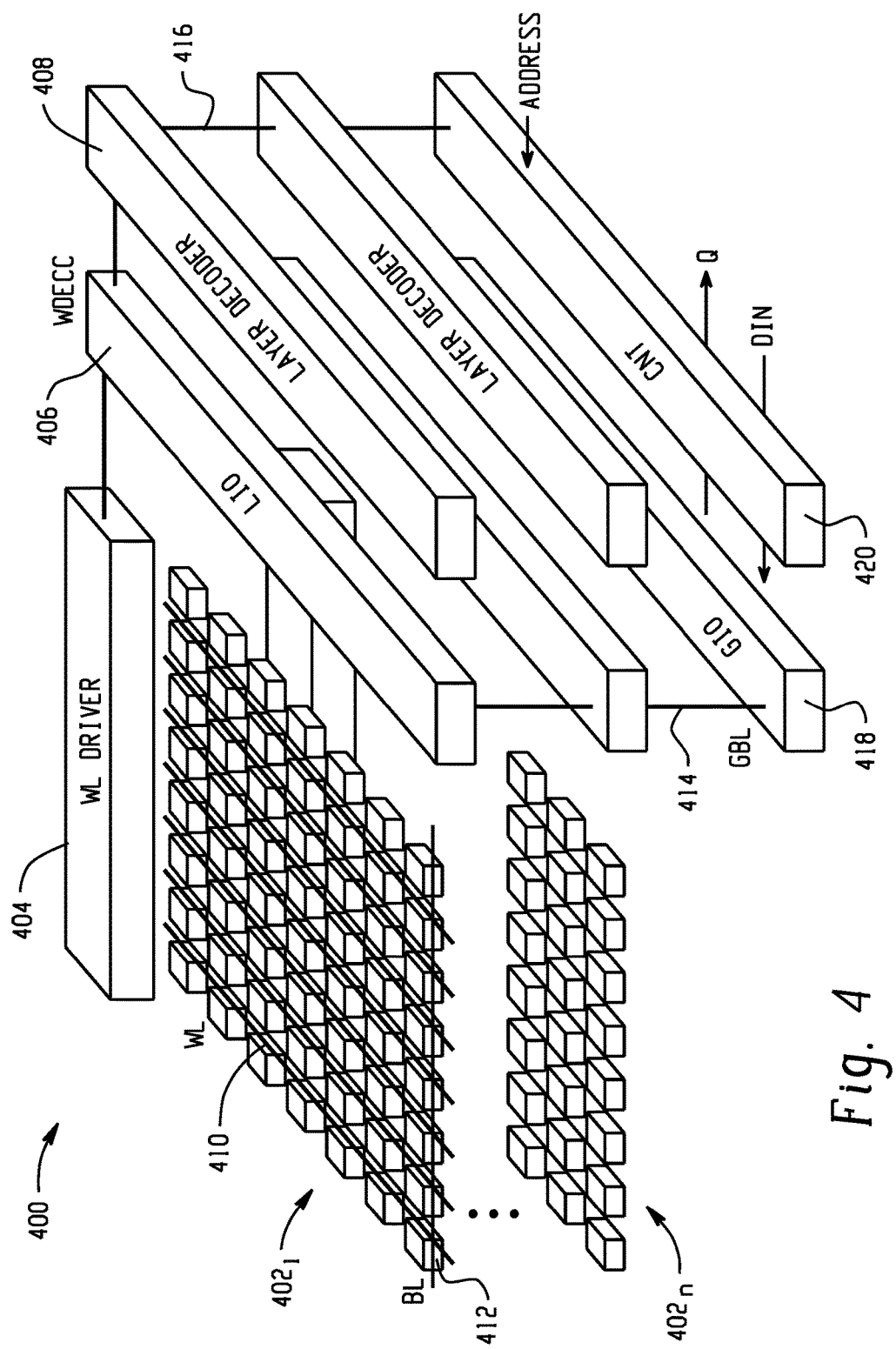
FIG. 4 depicts an example diagram showing a SRAM device fabricated in a multi-layer semiconductor device structure.

FIG. 4 depicts an example diagram showing a SRAM device fabricated in a multi-layer semiconductor device structure. As shown in FIG. 4, the SRAM device 400 includes multiple device layers (e.g., the layers $402_1$-$402_n$, where n is an integer larger than 1). Each device layer includes a number of SRAM cells arranged in columns and rows, a word-line (WL) driver, a LIO circuit, and a layer decoder. For example, the device layer $402_1$ includes a word-line (WL) driver 404, a LIO circuit 406, and a layer decoder 408. In addition, the device layer 402 includes one or more word lines 410 arranged along a first direction, and one or more local bit lines 412 arranged in a second direction that is perpendicular to the first direction.

One or more global bit lines (GBLs) 414 extend across all different device layers (e.g., the layers $402_1$-$402_n$) and connect with the LIO circuits (e.g., the LIO circuit 406) in the different device layers. In addition, one or more word-line-decoder (WDECC) lines 416 extend across all different device layers (e.g., the layers $402_1$-$402_n$) and connect with the WL drivers (e.g., the WL driver 404) in the different device layers. Furthermore, the SRAM device 400 includes a global control (CNT) circuit 420 configured to perform certain control functions and a global input/output (GIO) circuit 418 configured to read out data stored in a memory cell or receive data to be written to a memory cell.

In some embodiments, a particular device layer (e.g., one of the layers $402_1$-$402_n$) includes two groups of SRAM cells forming a butterfly structure. Specifically, the LIO circuit and the layer decoder of the particular device layer are located between the two groups of SRAM cells each arranged in columns and rows. For example, the two groups of SRAM cells have a same number of rows and a same number of columns. In certain embodiments, each of the device layers (e.g., the layers $402_1$-$402_n$) includes two groups of SRAM cells forming a butterfly structure. In some embodiments, the CNT circuit 420 and/or the GIO circuit 418 are located on top of or underneath the SRAM cells in a particular device layer (e.g., one of the layers $402_1$-$402_n$). In certain embodiments, the LIO circuit and/or the layer decoder of a particular device layer (e.g., any one of the layers $402_1$-$402_n$) are located on top of or underneath the SRAM cells in the same device layer.

Figure 5:
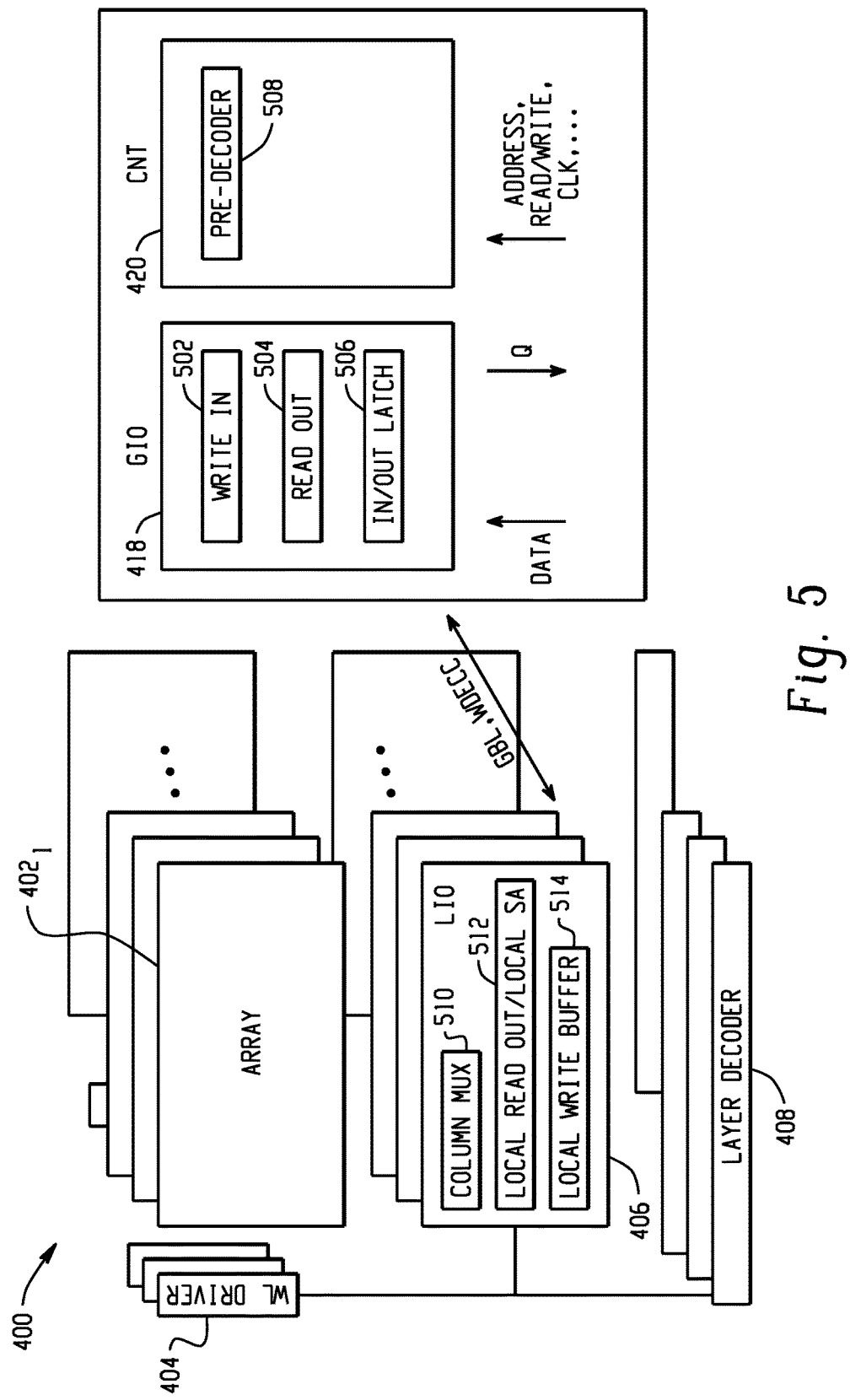
FIG. 5 depicts another example diagram showing the SRAM device as shown in FIG. 4.

FIG. 5 depicts another example diagram showing the SRAM device 400. As shown in FIG. 5, the GIO circuit 418 includes a write-in component 502 configured to receive data to be written to a target SRAM cell, a read-out component 504 configured to receive data read from a target SRAM cell, and an in/out latch 506 configured to temporarily store input or output data. The CNT circuit 420 includes a pre-decoder 508 configured to pre-decode certain input signals, such as address signals, read/write signals, and clock signals. After the input signals are pre-decoded, information associated with a target SRAM cell to be accessed for read/write operations is obtained, such as the device layer on which the target memory cell is located, and the row and the column corresponding to the target memory cell.

For example, based on the information obtained through pre-decoding the input signals, it is determined that the target SRAM cell is located on the device layer $402_1$. In response, the layer decoder 408 is used to activate the device layer $402_1$. Then, the WL driver 404 and the LIO circuit 406 are configured to activate a particular word line and one or more particular local bit lines for accessing the target SRAM cell. As shown in FIG. 5, the LIO circuit 406 includes a column multiplexer 510, a local-read-out/local-sense-amplifier component 512, and a local write buffer 514. The column multiplexer 510 is configured to select a particular column associated with the target SRAM cell. The local-read-out/local-sense-amplifier component 512 is configured to store data read from the target SRAM cell. In addition, the local write buffer 514 is configured to store data to be written to the target SRAM cell.

Referring to FIG. 4 and FIG. 5, through the GBL 414, the LIO circuit 406 sends data read from the target SRAM cell to the GIO circuit 418, or receives data to be written to the target SRAM cell from the GIO circuit 418. In some embodiments, data to be written to the target SRAM cell is transmitted to the LIO circuit 406 using an inter-layer structure other than the GBL 414. The layer decoder 408 communicates with the CNT circuit 420 through the WDECC line 416.

As an example, the SRAM cells in the SRAM device 400 include six-transistor SRAM cells (e.g., the SRAM cell 100), eight-transistor SRAM cells, or other types of SRAM cells. For example, more metal porosity is achieved since the global bit lines made of certain metal materials penetrate different layers in the SRAM device 400. In some embodiments, the GIO circuit 418 and the CNT circuit 420 are placed together in one of the device layers $402_1$-$402_n$. In certain embodiments, the GIO circuit 418 and the CNT circuit 420 are placed together in a separate device layer other than the device layers $402_1$-$402_n$. In other embodiments, the GIO circuit 418 and the CNT circuit 420 are placed in different device layers.

In some embodiments, the SRAM device 400 includes two device layers (e.g., n=2) and each device layer includes a SRAM array. The length of the GBL 414 and the length of the WDECC line 416 are comparable with a sum of the heights of the two device layers. In some embodiments, the global bit line 414 and the WDECC line 416 are much shorter than the global bit line 314 and the WDECC line 316 as shown in FIG. 3, respectively. For example, in each layer, an 1152-cell pitch is used along the first direction (i.e., the direction of the word line 410), and a 4-cell pitch is used along the second direction (i.e., the direction of the bit lines 412). The length of the word line 410 is approximately equal to the length of the 1152-cell pitch.

In certain embodiments, the SRAM device 400 includes eight device layers (e.g., n=8). The length of the global bit line 414 and the length of the WDECC line 416 are comparable with a sum of the heights of the eight device layers. In certain embodiments, the global bit line 414 and the WDECC line 416 are shorter than the global bit line 314 and the WLDV decoder 316 as shown in FIG. 3, respectively. For example, in each layer, a 288-cell pitch is used along the first direction (i.e., the direction of the word line 410), and a 4-cell pitch is used along the second direction (i.e., the direction of the bit line 412). Then, the length of the word line 410 is approximately equal to the length of the 288-cell pitch.

In certain embodiments, the GIO circuit 418 is located between any two of the device layers (e.g., the layers $402_1$-$402_n$). Specifically, the GIO circuit 418 is located between the LIO circuits of the two device layers, as an example. In some embodiments, the CNT circuit 420 is located between any two of the device layers (e.g., the layers $402_1$-$402_n$). Specifically, the CNT circuit 420 is located between the layer decoders of the two device layers, as an example.

Figure 6:
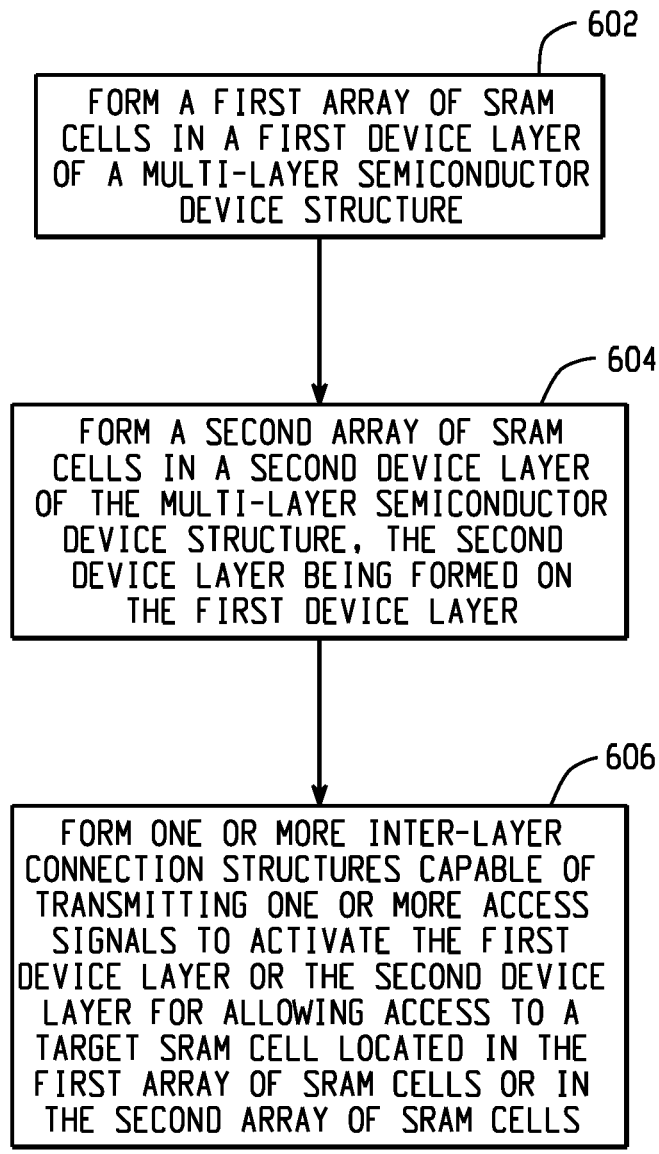
FIG. 6 depicts an example flow chart for fabricating a SRAM device in a multi-layer semiconductor device structure.

FIG. 6 depicts an example flow chart for fabricating a SRAM device in a multi-layer semiconductor device structure. At 602, a first array of SRAM cells are formed in a first device layer of a multi-layer semiconductor device structure. At 604, a second array of SRAM cells are formed in a second device layer of the multi-layer semiconductor device structure, the second device layer being formed on the first device layer. For example, the first array of SRAM cells and the second array of SRAM cells are arranged in columns and rows in the first device layer and the second device layer respectively. In each of the first device layer and the second device layer, one or more word lines are arranged along a first direction, and one or more local bit lines are arranged in a second direction that is perpendicular to the first direction.

At 606, one or more inter-layer connection structures are formed to transmit one or more access signals to activate the first device layer or the second device layer for allowing access to a target SRAM cell located in the first array of SRAM cells or in the second array of SRAM cells. For example, after certain input signals are pre-decoded, information associated with a target SRAM cell to be accessed for read/write operations is obtained, such as the device layer on which the target memory cell is located, and the row and the column corresponding to the target memory cell. If it is determined that the target SRAM cell is located on the first device layer, the first device layer is activated, and then a particular word line and one or more particular local bit lines in the first device layer are activated for accessing the target SRAM cell.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures. For example, certain transistors are described herein as examples, and the concepts, structures, layouts, materials, or operations may also be applicable to other types of semiconductor devices, such as bipolar junction transistors, diodes, capacitors, etc.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as "on," that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on and in immediate contact with the second layer/structure unless such is specifically stated; there may be one or more third layers/structures between the first layer/structure and the second layer/structure. The term "semiconductor device structure" used herein (including in the claims) may refer to shallow trench isolation features, poly-silicon gates, lightly doped drain regions, doped wells, contacts, vias, metal lines, or other types of circuit patterns or features to be formed on a semiconductor substrate.

What is claimed is:

1. A static random access memory (SRAM) device comprising:
   a first array of SRAM cells formed in a first device layer of a multi-layer semiconductor device structure, the first device layer further comprising a first word-line driver and a first local input/output circuit coupled to the first array of SRAM cells, the first device layer further comprising a first layer decoder coupled to the first word-line driver and the first local input/output circuit;
   a second array of SRAM cells formed in a second device layer of the multi-layer semiconductor device structure, the second device layer further comprising a second word-line driver and a second local input/output circuit coupled to the second array of SRAM cells, the second device layer further comprising a second layer decoder coupled to the second word-line driver and the second local input/output circuit, the second device layer being formed on the first device layer; and
   one or more inter-layer connection structures configured to transmit one or more access signals to activate the first device layer or the second device layer for allowing access to a target SRAM cell located in the first array of SRAM cells or in the second array of SRAM cells;
   wherein the first and second layer decoder are each configured to activate the respective word-line driver and the respective local input/output circuit of the respective device layer in response to the one or more access signals indicating that the target SRAM cell is located in the respective device layer.

2. The SRAM device of claim 1, wherein:
   the first device layer includes one or more first local access circuits; and
   the second device layer includes one or more second local access circuits.

3. The SRAM device of claim 2, wherein:
   the one or more first local access circuits include the first layer decoder, the first local input/output circuit, and the first word-line driver;
   the first local input/output circuit is configured to, in response to the target SRAM cell being located in the first device layer, activate one or more first local bit lines associated with the target SRAM cell; and
   the first word-line driver is configured to, in response to the target SRAM cell being located in the first device layer, activate a first word line associated with the target SRAM cell.

4. The SRAM device of claim 2, wherein:
   the one or more second local access circuits include the second layer decoder, the second local input/output circuit, and the second word-line driver;
   the second local input/output circuit is configured to, in response to the target SRAM cell being located in the second device layer, activate one or more second local bit lines associated with the target SRAM cell; and
   the second word-line driver is configured to, in response to the target SRAM cell being located in the second device layer, activate a second word line associated with the target SRAM cell.

5. The SRAM device of claim 1, further comprising:
   a third array of SRAM cells formed in a third device layer of the multi-layer semiconductor device structure, the third device layer being formed on the second device layer;
   wherein the one or more inter-layer connection structures are further configured to transmit the one or more access signals to activate the third device layer in response to the target SRAM cell being located in the third device layer for allowing access to the target SRAM cell.

6. The SRAM device of claim 1, further comprising: a global input/output circuit configured to output data read from the respective local input/output circuit of the target SRAM cell and receive data to be written to the respective local input/output circuit of the target SRAM cell.

7. The SRAM device of claim 6, wherein the one or more inter-layer connection structures are further configured to transmit data read from the respective local input/output circuit of the target SRAM cell to the global input/output circuit and transmit data to be written from the global input/output circuit to the respective local input/output circuit of the target SRAM cell.

8. The SRAM device of claim 6, wherein the global input/output circuit is formed in a third device layer of the multi-layer semiconductor device structure.

9. The SRAM device of claim 1, wherein the one or more inter-layer connection structures are formed in a third device layer of the multi-layer semiconductor device structure.

10. The SRAM device of claim 1, wherein the one or more inter-layer connection structures include one or more global bit lines and one or more word-line-decoder lines, the global bit lines and the word-line-decoder lines being configured to communicate with one or more first local access circuits in the first device layer and one or more second local access circuits in the second device layer.

11. The SRAM device of claim 1, wherein the one or more inter-layer connection structures extend across the first device layer and the second device layer.

12. The SRAM device of claim 1, wherein:
   the first array of SRAM cells are arranged in a number of first rows and a number of first columns, the first rows being associated with a number of first word lines, the first columns being associated with a number of first local bit lines; and
   the second array of SRAM cells are arranged in a number of second rows and a number of second columns, the second rows being associated with a number of second word lines, the second columns being associated with a number of second local bit lines.

13. The SRAM device of claim 1, wherein the first and second word-line driver are each configured to assert a word line associated with the target SRAM cell in response to activation of the respective word-line driver.

14. The SRAM device of claim 1, wherein the one or more inter-layer connection structures comprises:
a controller configured to receive an input signal indicating an address of the target SRAM cell, to decode the address of the target SRAM cell to produce the one or more access signals, and to transmit the one or more access signals to the first and second layer decoder.

15. A static random access memory (SRAM) device comprising:
a first array of SRAM cells formed in a first device layer of a multi-layer semiconductor device structure, the first device layer further comprising a first word-line driver and a first local input/output circuit coupled to the first array of SRAM cells, the first device layer further comprising a first layer decoder coupled to the first word-line driver and the first local input/output circuit;
a second array of SRAM cells formed in a second device layer of the multi-layer semiconductor device structure, the second device layer further comprising a second word-line driver and a second local input/output circuit coupled to the second array of SRAM cells, the second device layer further comprising a second layer decoder coupled to the second word-line driver and the second local input/output circuit, the second device layer being formed on the first device layer;
one or more inter-layer connection structures configured to transmit one or more access signals to activate the first device layer or the second device layer for allowing access to a target SRAM cell located in the first array of SRAM cells or in the second array of SRAM cells; and
an input/output circuit configured to output data read from the target SRAM cell and receive data to be written to the target SRAM cell;
wherein the first and second layer decoder are each configured to activate the respective word-line driver and the respective local input/output circuit of the respective device layer in response to the one or more access signals indicating that the target SRAM cell is located in the respective device layer.

16. The SRAM device of claim 15, further comprising:
a third array of SRAM cells formed in a third device layer of the multi-layer semiconductor device structure, the third device layer being formed on the second device layer;
wherein the one or more inter-layer connection structures are further configured to transmit the one or more access signals to activate the third device layer in response to the target SRAM cell being located in the third device layer for allowing access to the target SRAM cell.

17. The SRAM device of claim 15, wherein the input/output circuit is a global input/output circuit and is formed in a third device layer of the multi-layer semiconductor device structure.

18. The SRAM device of claim 15, wherein:
the first device layer includes one or more first local access circuits; and
the second device layer includes one or more second local access circuits.

19. The SRAM device of claim 18, wherein:
the one or more first local access circuits include the first layer decoder;
the one or more second local access circuits include the second layer decoder;
the first layer decoder is configured to activate the first device layer in response to the one or more access signals indicating that the target SRAM cell is located in the first device layer; and
the second layer decoder is configured to activate the second device layer in response to the one or more access signals indicating that the target SRAM cell is located in the second device layer.

20. A method for fabricating a static random access memory (SRAM) device comprising:
forming a first array of SRAM cells in a first device layer of a multi-layer semiconductor device structure, the first device layer further comprising a first word-line driver and a first local input/output circuit coupled to the first array of SRAM cells, the first device layer further comprising a first layer decoder coupled to the first word-line driver and the first local input/output circuit;
forming a second array of SRAM cells in a second device layer of the multi-layer semiconductor device structure, the second device layer further comprising a second word-line driver and a second local input/output circuit coupled to the second array of SRAM cells, the second device layer further comprising a second layer decoder coupled to the second word-line driver and the second local input/output circuit, the second device layer being formed on the first device layer; and
forming one or more inter-layer connection structures capable of transmitting one or more access signals to activate the first device layer or the second device layer for allowing access to a target SRAM cell located in the first array of SRAM cells or in the second array of SRAM cells;
wherein the first and second layer decoder are each configured to activate the respective word-line driver and the respective local input/output circuit of the respective device layer in response to the one or more access signals indicating that the target SRAM cell is located in the respective device layer.

* * * * *